United States Patent
Branchevsky

(10) Patent No.: US 6,470,545 B1
(45) Date of Patent: Oct. 29, 2002

(54) METHOD OF MAKING AN EMBEDDED GREEN MULTI-LAYER CERAMIC CHIP CAPACITOR IN A LOW-TEMPERATURE CO-FIRED CERAMIC (LTCC) SUBSTRATE

(75) Inventor: Shaul Branchevsky, Mission Viejo, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 41 days.

(21) Appl. No.: 09/632,361

(22) Filed: Aug. 3, 2000

Related U.S. Application Data

(63) Continuation-in-part of application No. 09/396,151, filed on Sep. 15, 1999, now Pat. No. 6,252,761.

(51) Int. Cl.[7] .................................................. H01G 7/00
(52) U.S. Cl. ................... 29/25.42; 29/25.41; 29/830; 29/831; 29/832; 361/305; 361/306.3; 361/320; 361/330; 361/309; 361/310; 361/313
(58) Field of Search ....................... 29/25.41, 25.42, 29/830, 831, 832; 361/305, 306.3, 320, 330, 309, 310, 313

(56) References Cited

U.S. PATENT DOCUMENTS

| | | | | |
|---|---|---|---|---|
| 4,471,406 A | * | 9/1984 | Sawairi | 361/328 |
| 4,517,406 A | * | 5/1985 | Erdle | 174/72 |
| 4,734,818 A | * | 3/1988 | Hernandez | 361/306 |
| 4,740,863 A | * | 4/1988 | Langlois | 361/309 |
| 4,748,537 A | * | 5/1988 | Hernandez | 361/306 |
| 5,027,253 A | * | 6/1991 | Lauffer | 361/321 |
| 5,036,424 A | * | 7/1991 | Yokotani | 361/321 |
| 5,046,236 A | * | 9/1991 | Wada | 29/610.1 |
| 5,319,517 A | * | 6/1994 | Nomura | 361/321.4 |
| 5,661,882 A | * | 9/1997 | Alexander | 29/25.42 |
| 5,687,055 A | * | 11/1997 | Miki | 361/305 |
| 5,736,448 A | * | 4/1998 | Saia | 438/393 |
| 6,011,683 A | * | 1/2000 | Dat | 361/306.1 |

OTHER PUBLICATIONS

Drue et al., "RF Models of Passive LTCC Components in the Lower Gigahertz–Range", Applied Microwave & Wireless, Apr. 1998, pp. 26–35.

Delaney et al., "Characterisation Of The Electrical Performance Of Buried Capacitors And Resistors In Low Temperature Co–Fired (LTCC) Ceramic", 1998 Electronic Components and Technology Conference, pp. 900–908.

Delaney et al., "Characterization and Performance Prediction for Integral Capacitors in Low Temperature Co–Fired Ceramic Technology", IEEE Transactions on Advanced Packaging, vol. 22, No. 1, Feb. 1999, pp. 68–77.

* cited by examiner

*Primary Examiner*—Peter Vo
*Assistant Examiner*—Paul Kim
(74) *Attorney, Agent, or Firm*—Beyer Weaver & Thomas, LLP

(57) ABSTRACT

Embedded green multi-layer ceramic capacitors in low-temperature co-fired ceramic (LTCC) substrates are provided. A first set of electrodes is printed on a ceramic tape. A first dielectric layer is placed over the first set of electrodes and the ceramic tape. A second set of electrodes is printed on the first dielectric layer. A second dielectric layer is placed over the second set of electrodes and the first dielectric layer. A third set of electrodes is printed on the second dielectric layer. The sheet is then cut to form separate green multi-layer ceramic capacitor chips. The green multi-layer ceramic capacitor chips are then placed in a cavity formed by ceramic tape.

16 Claims, 15 Drawing Sheets

METHOD OF MAKING AN EMBEDDED GREEN MULTI-LAYER CERAMIC CHIP CAPACITOR IN A LOW-TEMPERATURE CO-FIRED CERAMIC (LTCC) SUBSTRATE

CROSS-REFERENCE TO RELATED APPLICATIONS

This application is a continuation-in-part of U.S. Application No. 09/396,151, filed on Sep. 15, 1999.

BACKGROUND OF THE INVENTION

1. Field of the Invention

The present invention relates generally to the field of capacitors, and more particularly to embedded multi-layer capacitors formed in a low-temperature co-fired ceramic (LTCC) substrate.

2. Description of the Related Art

Conventionally, electronic circuit components, including silicon chips, have been mounted on printed circuit boards. More recently, in order to reduce the size associated with conventional printed circuit boards, low-temperature co-fired ceramic (LTCC) substrates have been used.

A typical LTCC configuration comprises multiple layers of ceramic "tape" which are used to provide the base structure upon which to form various electronic components and electrical connections. The tape is formed from a powdered ceramic, mixed with a binder. For example, one type of ceramic tape available from Dupont is known as "Green Tape 951." The electronic components that can be formed include resistors, capacitors, inductors, and the like. The electrical connections, formed through each tape layer are known as "vias." The components are formed by punching holes/vias in the tape as appropriate, and layering on metal, dielectrics, insulators, etc. Several layers of tape may be used in order to form the desired circuitry. The tape layers are then pressed together and fired in an oven to remove the binder and to sinter the ceramic powder. Components which are too large or too difficult to form within the ceramic tape layers, such as silicon capacitors, resistors, inductors, and chips, may be surface mounted on the hardened substrate. The resulting substrate is usually less than 1"×1" thus providing a compact circuit package.

FIG. 1 shows an example of the structure of a basic capacitor 10 formed within an LTCC substrate. A standard process to form this structure will now be described, with reference to FIG. 1. First, a hole is punched in a first tape layer 12 to form an opening. A silver, silver palladium, or similar paste is wiped across the hole to form a via 16, which is used as one terminal connection for the capacitor 10. Next, a first electrode 18 may be formed on top of the via 16 using silver, silver palladium or other similar electrode paste. After the electrode 18 has dried, a dielectric 20 is formed on top of the electrode 18. A dielectric paste is usually used, which when hardened, provides the desired dielectric properties. A second electrode 22 is then formed on top of the dielectric layer 20. These various component layers are commonly formed using a screen printing process. A second ceramic tape layer 14 having a via 24 is then pressed on top of the first layer 12. The second via 24 provides a second terminal for the capacitor 10. After the substrate is fired at 750–950° C., a capacitor structure 30 is formed as shown in FIG. 2. A top view of the capacitor structure 30 is shown in FIG. 3. The vias can have cross-sectional shapes of circles, squares, or rectangles.

This procedure forms what is known in the art as a single layer ceramic capacitor (SLCC), also known as a monolayer capacitor. Another embodiment of an SLCC is shown in FIG. 4. Specifically, the vias 42, 44 may be formed on the side of the electrodes 46,48, or with one via 42 in the middle of one electrode 46, and one via 44 on the side of the other electrode 48. The electrodes and dielectrics may also be formed as circles, squares or rectangles as shown in FIGS. 5(A)–5(C).

For standard capacitor configurations, the capacitance of a structure is determined according to the following formula:

$C=(kA)/t$, where k is the dielectric constant of the dielectric material, A is the overlapping area between the electrodes, and t is the thickness of the dielectric, as shown in FIG. 7. Note that in FIG. 7, the dielectric area A and the electrode area A are presumed to be the same, but in practice the dielectric is usually made larger to ensure that the electrode layers do not touch. Thus, by changing the dielectric material, the capacitance value may be changed. FIG. 6 illustrates an SLCC in which a different dielectric is used, in order to change the capacitance. Instead of using a dielectric paste, the dielectric may be formed from a high firing temperature ceramic tape (1100–1400° C.). The high temperature tape 66 is fired separately, and then placed on the first electrode 72. The dielectric constant of the high temperature tape 66 is several orders of magnitude greater ($k=20-20,000$) than the dielectric constant of the standard tape ($k=7-8$) used to form the layers 62, 64. Standard tape 68,70 may be used around the dielectric to provide a constant thickness between the main layers 62, 64.

Two articles which discuss LTCC technology include "Characterization and Performance Prediction for Integral Capacitors in Low Temperature Co-Fired Ceramic Technology," Delaney et al., *IEEE Transactions on Advanced Packaging*, Vol. 22, No. 1, February. 1999, pgs. 68–77; and "Characteristics of the Electrical Performance of Buried Capacitors and Resistors in Low Temperature Co-Fired (LTCC) Ceramic," Delaney et al., 1998 *Electronic Components and Technology Conference*, pgs. 900–908, the disclosures of which are herein incorporated by reference. While these articles seek to address the problem of providing capacitors with increased capacitance, the capacitors are still confined to being formed within a single layer of ceramic tape. The disclosed processes cannot make high capacitance capacitors and they require numerous types of dielectric materials in order to create different capacitances.

Since there is a practical limit to the dielectric constant that can be achieved, single layer capacitors do not provide sufficient capacitance within a reasonable area, for many applications. Thus, for high value capacitances, external capacitors are often surface mounted on the ceramic substrate. An example of one type of capacitor 8000 used for this purpose is shown in FIG. 8. Multiple layers of electrodes are formed in a discrete ceramic capacitor, and are used in order to increase the capacitance, while still providing a relatively small component. Adding external components, however, increases the costs associated with the LTCC circuit.

It would thus be desirable to have a multi-layer capacitor, embedded in the ceramic block, to reduce costs associated with manufacturing and attaching external capacitors, and to provide increased capacitance as compared to SLCCs.

SUMMARY OF THE INVENTION

To achieve the foregoing and other objects and in accordance with the purpose of the present invention, a variety of techniques for providing an embedded multi-layer capacitor in a low-temperature co-fired ceramic (LTCC) substrate. A first set of electrodes is formed. A first dielectric sheet is placed over the first set of electrodes. A second set of electrodes is formed over the first dielectric sheet, where the second set of electrodes at least partially overlap with the first set of electrodes. In the specification and claims a dielectric sheet may be one or more layers of material that are placed together to form a laminate or block, with the term "sheet" descriptive of a geometrical shape, having a breadth that is much greater than its thickness. A second dielectric sheet is placed over the second set of electrodes and the first dielectric sheet. A third set of electrodes is formed over the second dielectric sheet, where the third set of electrodes at least partially overlaps the second set of electrodes. The first and second dielectric sheets are cut thus forming a plurality of multi-layer capacitor chips, where each multi-layer capacitor chip comprises a first electrode from the first set of electrodes, a second electrode from the second set of electrodes, and a third electrode from the third set of electrodes.

The present invention is not limited to any specific configuration of vias or openings, and numerous alternatives are envisioned, such as circular or rectangular openings, and cylindrical or rectangular block vias. Two capacitors may even be formed in the same opening, by having vias on four sides of the opening, and alternating the electrode layers. The dielectric layers may also be formed from different materials, providing different dielectric constants.

Thus, the present invention is not limited to any specific configuration or geometry of openings or vias, but the teachings encompass any structure having exposed vias connected to the edges of alternating layers of electrodes, in order to provide electrical connectivity.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The following description is provided to enable any person skilled in the art to make and use the invention and sets forth the best modes contemplated by the inventor for carrying out the invention. Various modifications, however, will remain readily apparent to those skilled in the art, since the basic principles of the present invention have been defined herein specifically to provide an embedded multi-layer ceramic chip capacitor in a low-temperature co-fired ceramic (LTCC) substrate.

In general, the present invention provides a unique structure for creating multi-layer ceramic capacitors in LTCC substrates. Specifically, in order to create multiple layers of electrodes, the individual electrode layers must be connected electrically. The present invention solves the problem of electrically connecting the multiple electrode layers by providing exposed vias adjacent to the electrode layers to provide a common electrical connection.

Figure 1:
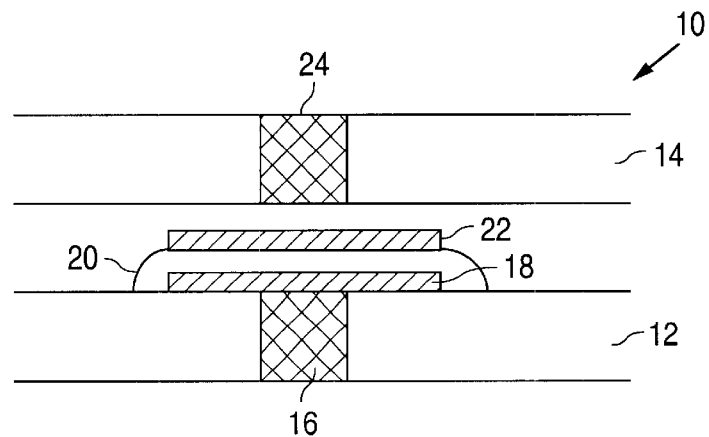
FIG. 1 is diagram of a prior art single layer ceramic capacitor (SLCC).
Figure 2:
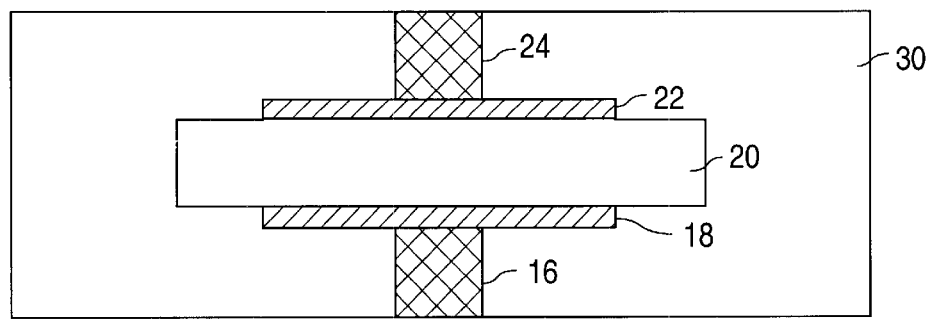
FIG. 2 is a diagrain of the SLCC of FIG. I after the ceramic tape has been pressed and fired.
Figure 3:
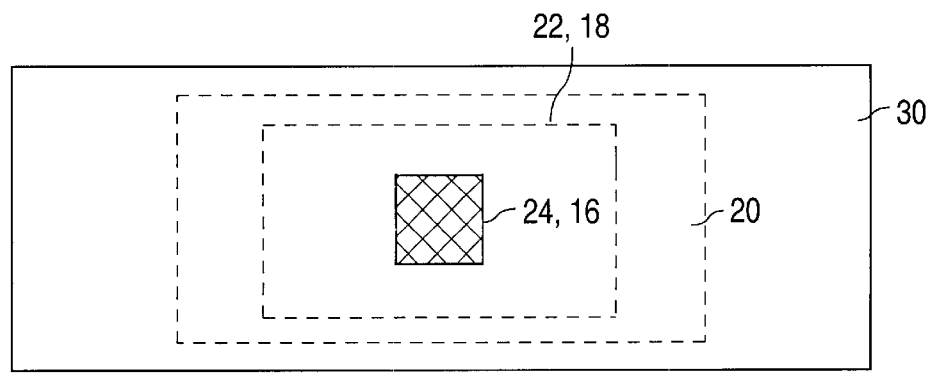
FIG. 3 is a top view of the capacitor of FIG. 2.
Figure 4:
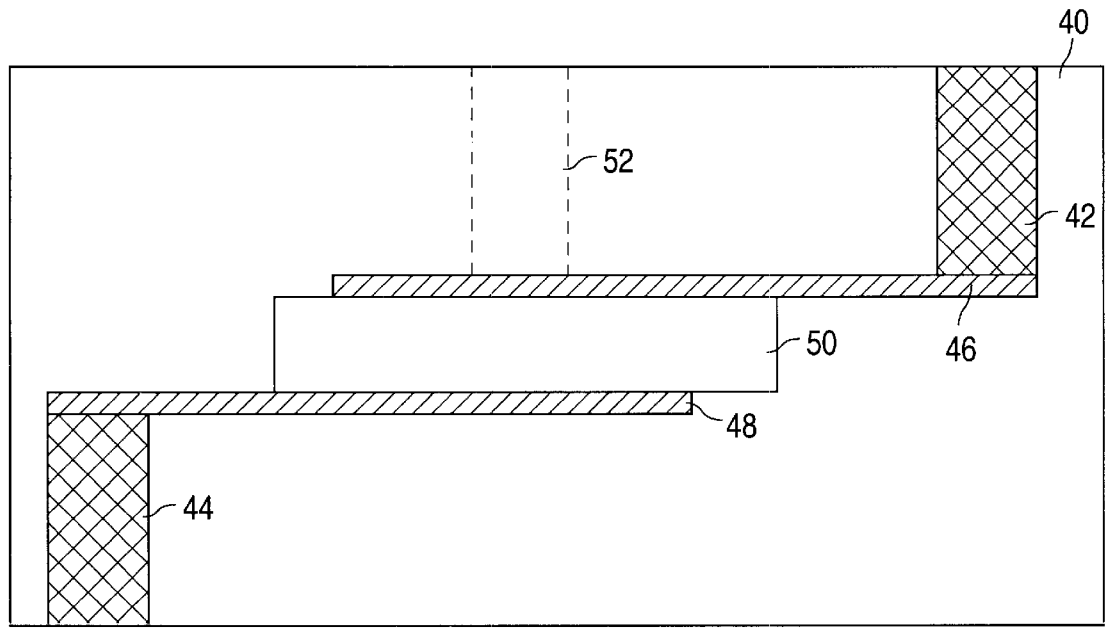
FIG. 4 is a diagram of an alternative embodiment of an SLCC according to the prior art.
Figure 5A:
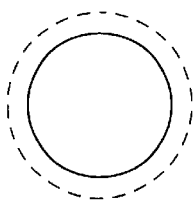
FIGS. 5(A)–5(C) are diagrams of different configurations of the electrodes and dielectric layers of an SLCC according to the prior art.
Figure 5B:
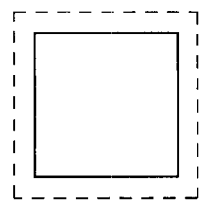
Figure 5C:
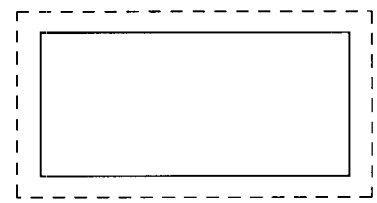
Figure 6:
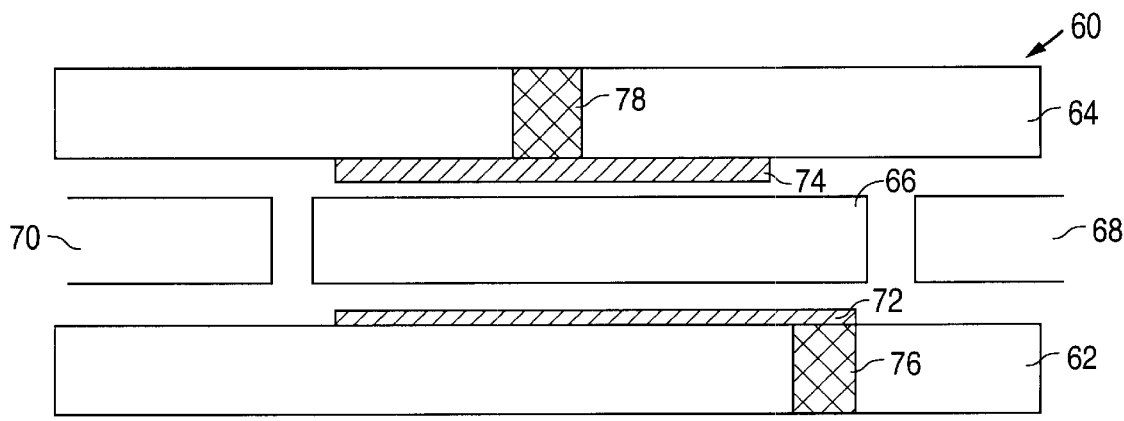
FIG. 6 is a diagram of an SLCC according to the prior art having a high-temperature ceramic tape used as a dielectric.
Figure 7:
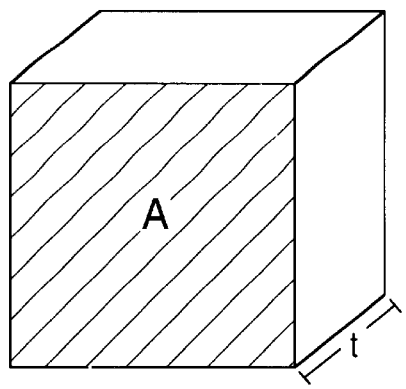
FIG. 7 is a diagram illustrating the area and thickness variables as used in the standard capacitance formula.
Figure 8:
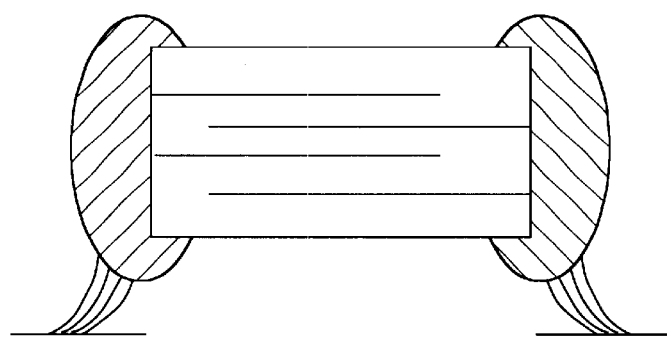
FIG. 8 is a diagram of a prior art, discrete ceramic multi-layer capacitor suitable for surface mounting on an LTCC substrate.
Figure 9:
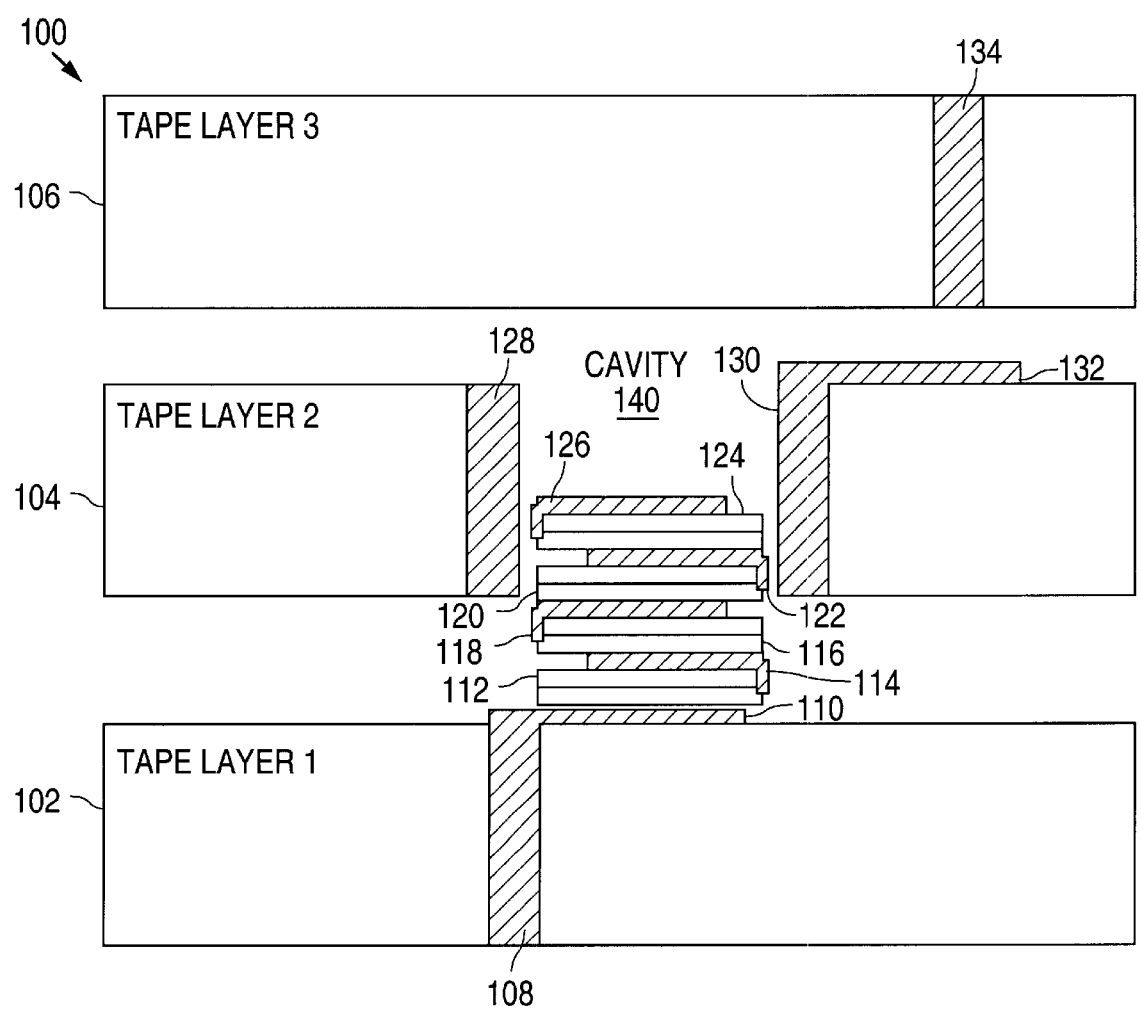
FIG. 9 is a diagram illustrating an embedded multi-layer LTCC formed according to a preferred embodiment of the present invention.
Figure 10:
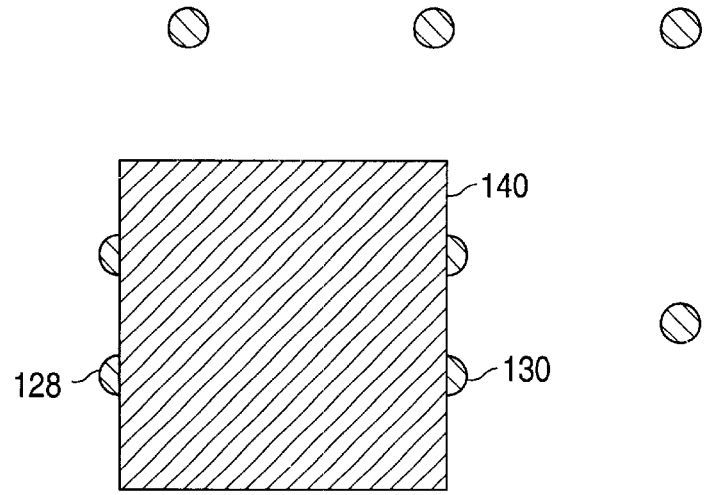
FIG. 10 is a diagram illustrating an opening in a tape layer suitable for use with the present invention.
Figure 11:
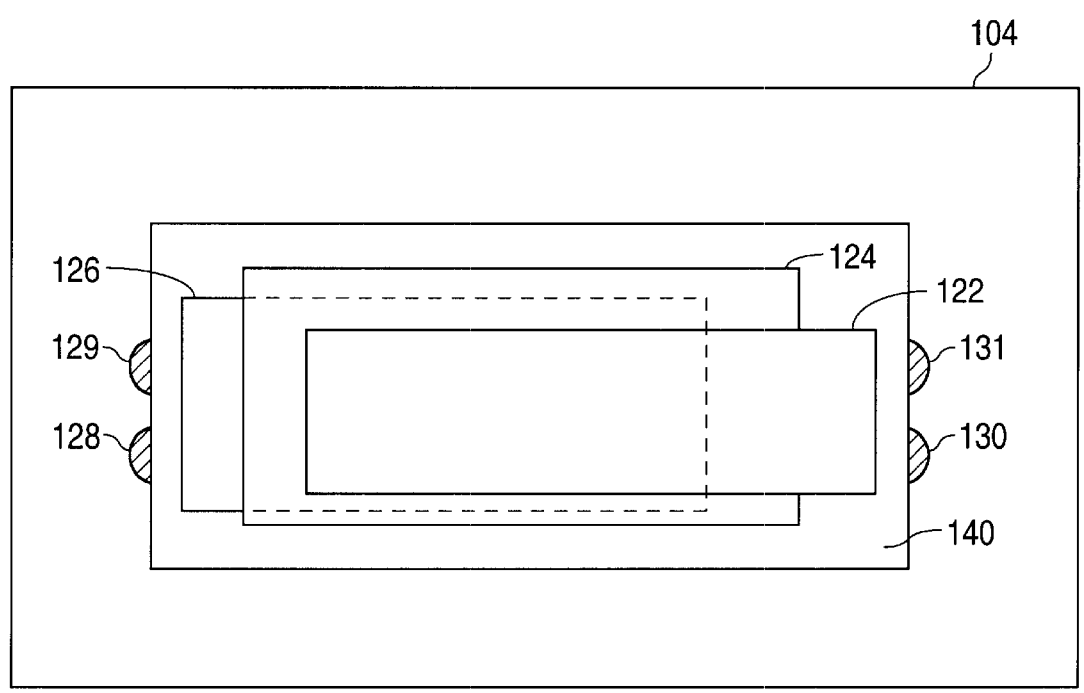
FIG. 11 is a top view of the capacitor of FIG. 9.

A preferred embodiment of the present invention is illustrated in FIG. 9. An embedded multi-layer ceramic capacitor 100 is formed using three ceramic tape layers 102, 104, 106. In a standard LTCC substrate, additional layers are used to form additional circuitry. These additional layers are omitted from the discussion herein for clarity. The first tape layer 102 is formed with a via 108 in the conventional manner. The second layer 104, however, is first formed with appropriately spaced vias 128, 130, which are then punched through to expose a cross-section thereof. FIG. 10 shows a top view of one embodiment of the second layer 104 that may be used for the multi-layer ceramic capacitor structure 100. Note that in FIG. 10 the cylindrical vias 128, 130 are bisected by an opening 140 created in the tape layer 104. Many other configurations are easily envisioned and are within the scope of the present invention. For example, the vias may be formed as rectangular blocks, with the opening exposing a side surface of each via, without necessarily bisecting the blocks. Also, in the preferred embodiment, two vias are bisected on each side of the opening 140, though only one via per side may be used.

The opening 140 in the second layer 104 provides a cavity in which to build the multiple electrode and dielectric layers needed to form a multi-layer capacitor. Specifically, as shown in FIG. 9, a first electrode layer 110 is formed on top of the first tape layer 102, overlapping the via 108. Alternating layers of dielectric material 112, 116, 120, 124 and electrodes 114, 118, 122, 126 are then formed on top of the first electrode layer 110. The electrode layers 114, 118, 122, 126 are formed so that each successive layer corresponds to an alternate terminal. In other words, layers 110, 118 and 126 form a first set of electrodes, which connect to the via 108 in the first tape layer 102. The remaining electrode layers 114 and 122 form a second set of electrodes, which connect to the via 134 in the third tape layer 106. The two vias 108, 134 thus correspond to the standard two terminals of a standard capacitor.

Figure 12:
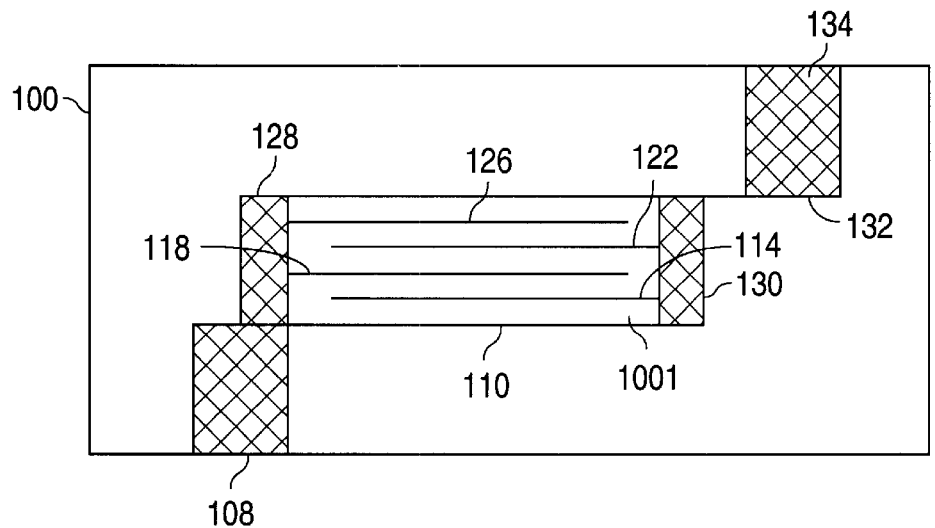
FIG. 12 is a side view of the capacitor of FIG. 9, after firing.

An individual electrode layer 114 is formed such that one end is exposed past the underlying dielectric layer 112 to connect to the adjacent exposed via 130, while the other end of the electrode 114 is formed to ensure that it does not connect to the adjacent exposed via 128. By alternating the just described electrode configuration, each electrode layer is electrically connected to an alternating exposed via. An electrical connection is formed on top of the second tape layer 104 to connect to the via 134 in the third tape layer 106. The exposed vias 128, 130 thus provide electrical connections for alternating sets of electrodes, allowing multi-layer ceramic ,capacitors to be formed within an LTCC substrate. When the tape layers 102, 104, 106 (and any additional LTCC layers) are pressed together and ovenfired, the silver paste (or other similar material) used to the form the exposed vias 128, 130 and electrode layers 110, 114, 118, 122, 126 flows and joins together forming a permanent electrical connection. FIG. I I illustrates a top view of the capacitor structure 100 illustrated in FIG. 9. FIG. 12 is a side view of the capacitor of FIG. 9, showing the structure after it has been pressed and fired. Notice that the dielectric material 1001 is now disposed between and around the electrodes such that the opening 140 no longer exists.

Although the preferred embodiment has been described with reference to four layers, a capacitor may be formed having greater or fewer layers. Additional tape layers may also be added between the first 102 and third 106 tape layers to provide more volume in which to build the capacitor layers. These additional tape layers are basically formed as duplicates of the second tape layer 104, with an opening punched exposing vias on the side, in which the vias provide electrical connections for the alternating layers of electrodes, and with the other tape layer(s).

Figure 16:
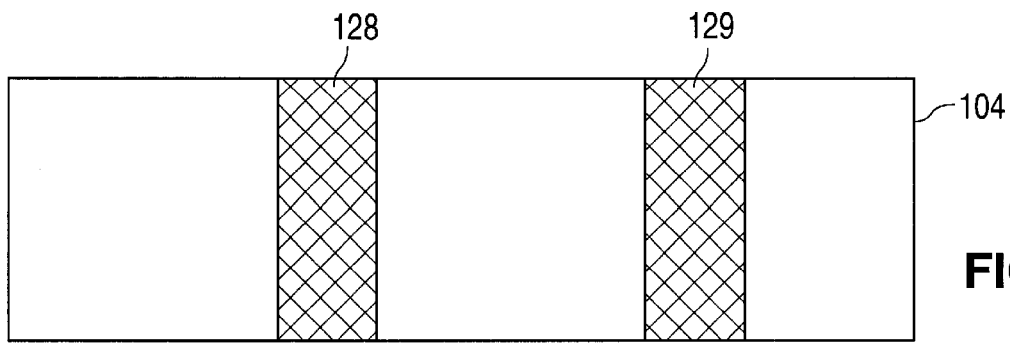
FIG. 16 is a diagram of a cross-section of a tape layer showing the bisected, exposed vias.

In the preferred embodiment, the opening 140 in the second tape layer is formed using a mechanical punch to remove the ceramic tape and expose the vias. A cross-section of one end of an opening is illustrated in FIG. 16 showing the exposed bisected vias 128, 129. Any other methods known to those skilled in the art to remove the ceramic tape may also be used. Additionally, for capacitors having many layers, a standard screen printing process may damage the structure as the layers are being built. To overcome this problem, sidewalls formed from ceramic tape may be used to facilitate the construction of the capacitor. The sidewalls are then removed before adding the second and third tape layers.

In the preferred embodiment, the dielectric layers are formed using a standard dielectric paste. There is no requirement that the same dielectric material be used for each layer, or even that the dielectric layers have the same thickness. In fact, the electrodes themselves may have different sizes, thickness, or have a different alternating pattern than those specifically described herein.

Figure 13A:
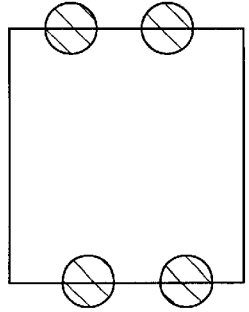
FIGS. 13(A)–13(J) illustrate top views of various alternative embodiments of the vias and openings for a capacitor according to the present invention.
Figure 13B:
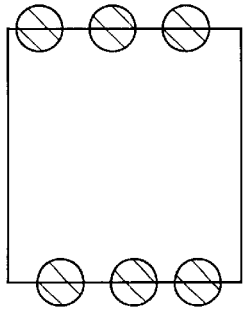
Figure 13C:
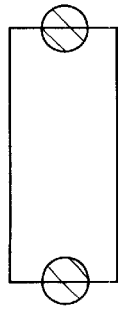

As mentioned above, in the preferred embodiment the vias in the second tape layer 104 are formed as cylinders and are bisected with a square opening 140. As shown in FIGS. 13(A)–13(J) (top views), however, numerous alternate embodiments may also be configured. Specifically, FIGS. 13(A)–13(C) illustrate that one, two or three cylindrical vias may be used on each side of the opening. FIG. 13(I) illustrates an embodiment wherein the opening is round instead of square, with the associated electrode and dielectric layers formed as circles to fit within the rounded opening. FIGS. 13(E) and 13(H) illustrate embodiments in which the vias are wider, providing greater surface area to contact the electrodes.

These embodiments illustrate that the vias are generally bisected, but more or less of the via may be removed by the punching process without departing from the scope of the present invention. In fact, in a configuration in which the vias have a flat-facing surface (as viewed from the opening), only enough of the ceramic tape needs to be removed as will expose the surface of the vias. Thus, the present invention is not limited to any specific configuration or geometry of openings or vias, but is deemed to encompass any structure having exposed vias connected to the edges of alternating layers of electrodes, in order to provide electrical connectivity.

Figure 14:
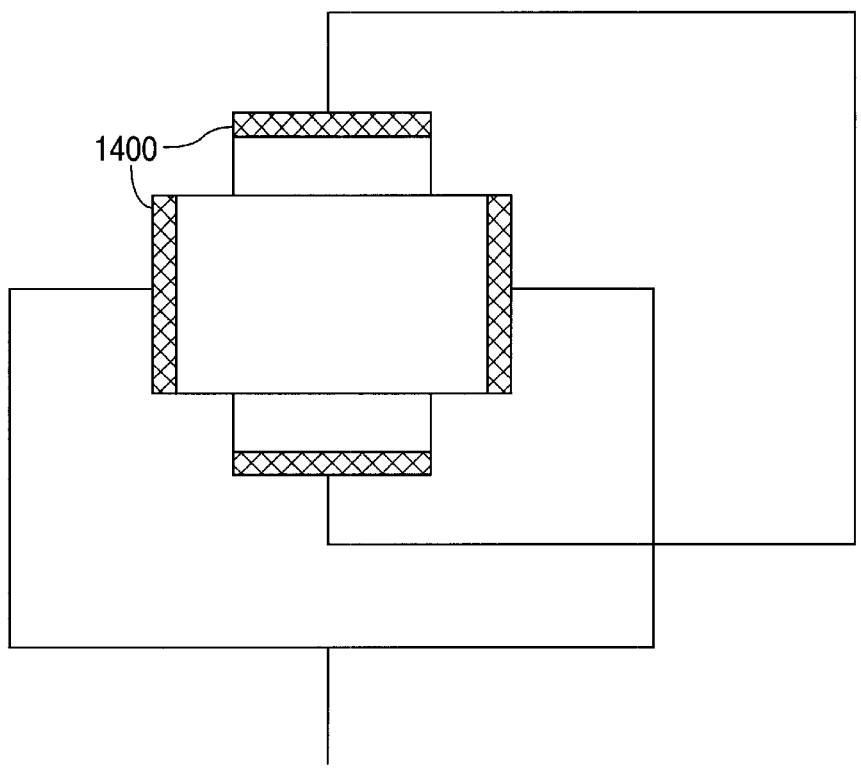
FIG. 14 is a diagram of two capacitors formed within a single opening.

FIGS. 13(D), 13(F), 13(G), and 13(J) illustrate several possible configurations for creating two different capacitors within the same opening, by using vias on each side of the opening. These configurations will now be explained further with reference to FIGS. 14 and 15. In FIG. 14, corresponding to the via structure of FIG. 13(F), two separate capacitors are formed within the same opening. By orienting the capacitors' electrodes 1400 90° to each other, the configuration provides better performance at high frequencies for certain design applications. Also, the effective surface are for one capacitor structure may be different than the area for the second structure. This allows two capacitors to be formed in a single opening, providing a significant size advantage as compared to the SLCC designs of the prior art.

Figure 13D:
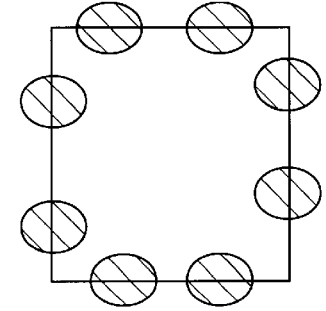
Figure 13E:
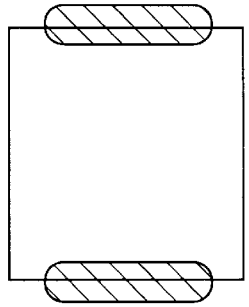
Figure 13F:
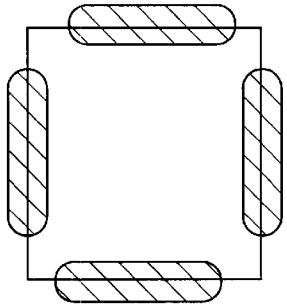
Figure 13G:
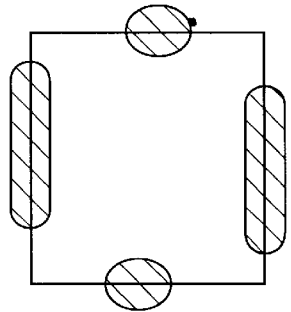
Figure 13H:
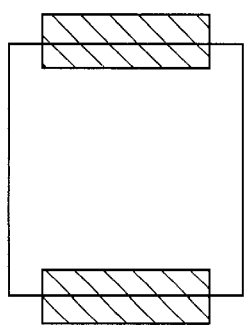
Figure 13I:
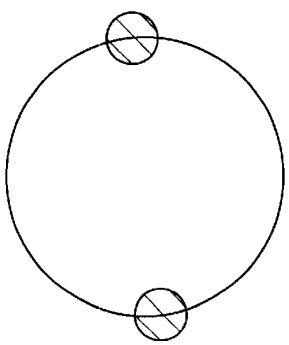
Figure 13J:
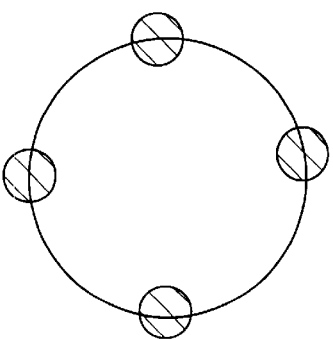
Figure 15:
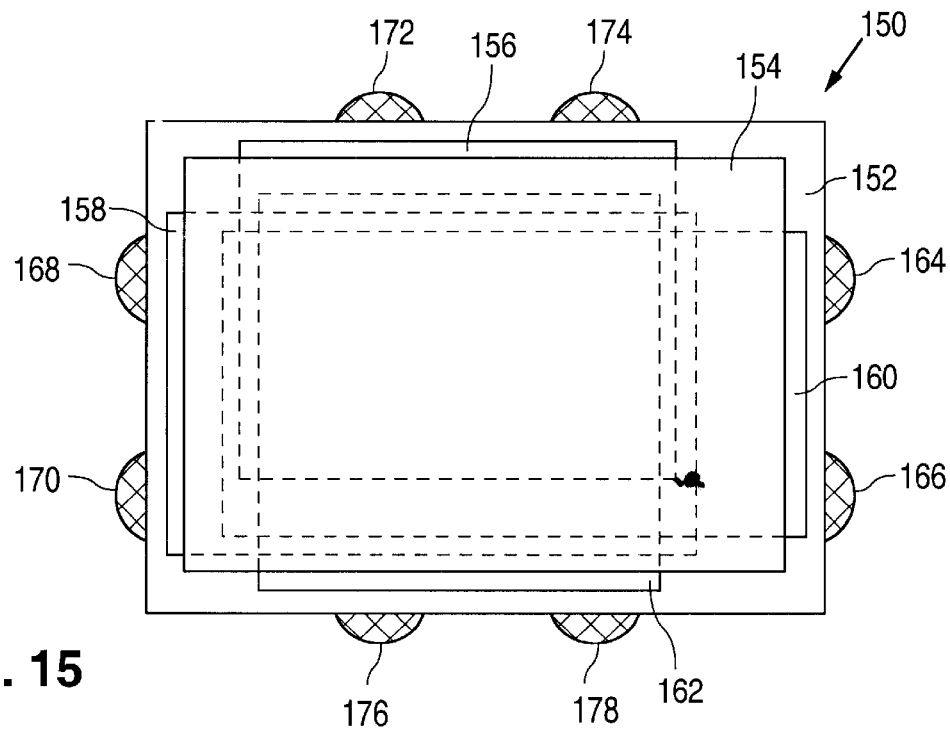
FIG. 15 is a diagram of two capacitors formed within a single opening, with each electrode having a different surface area.
Figure 17:
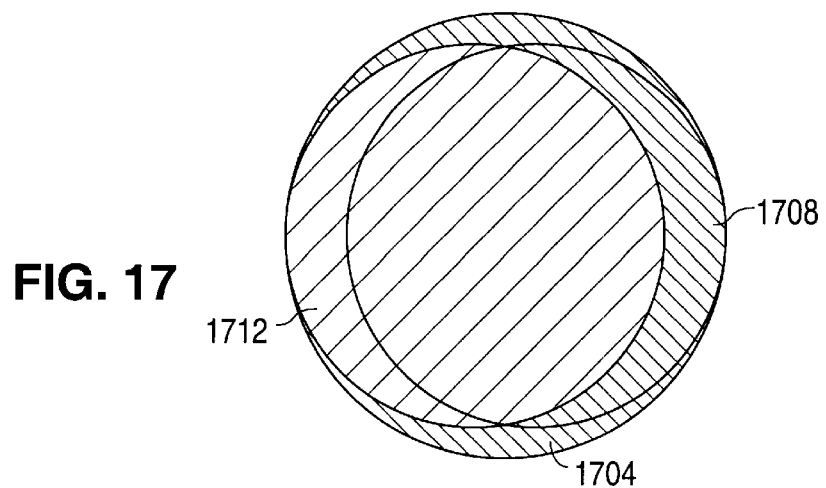
FIG. 17 is a diagram illustrating an embodiment of the present invention in which the electrodes and dielectric layers are round.

FIG. 15, corresponding to the via structure of FIG. 13(D), illustrates that four different electrode sizes may be interleaved as desired to provide two different capacitances within a single opening 152. Specifically, two sets of electrodes 156, 158 may be formed at right angles corresponding to a first capacitor. Two additional sets of electrodes 160, 162 are also formed in the same opening 152. Dielectric layers 154 are inter-spaced between the electrode layers. Each set of electrodes has a corresponding set of vias. This structure provides significant space savings over the previously utilized SLCC. Those skilled in the art will appreciate that many other configurations other than those specifically described herein may be formed utilizing the basic teachings of the present invention. For example, the electrodes and dielectrics may be shaped as necessary to fit any desired shape of opening such as a circle. A circular embodiment using a circular opening 1704, a first circular electrode 1708, and a second circular electrode 1712 is illustrated in FIG. 17.

Figure 18:
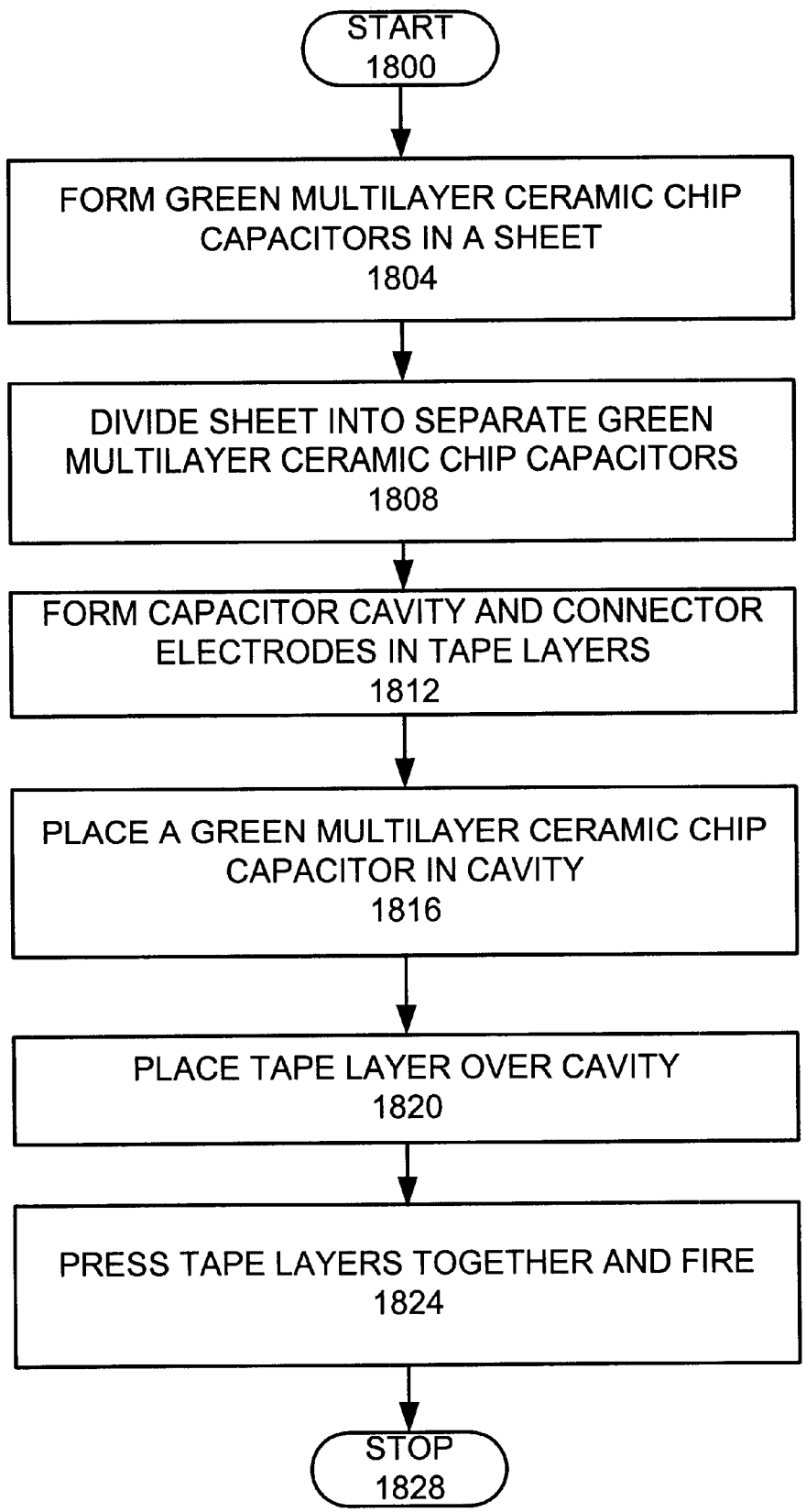
FIG. 18 is a high level flow chart of another embodiment of the invention for forming an embedded green multi-layer ceramic chip capacitor in a LTCC substrate.
Figure 19:
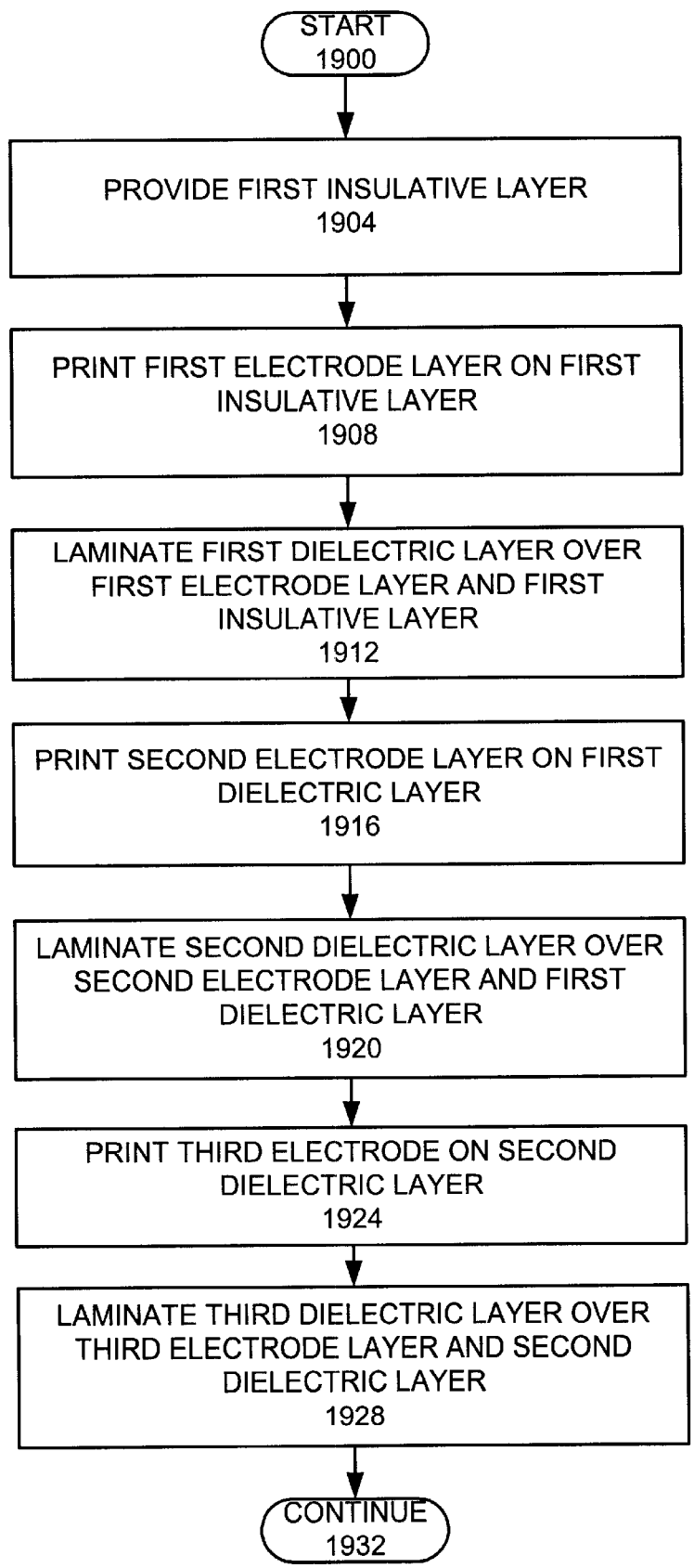
FIG. 19 is a flow chart of the step of forming the green multi-layer ceramic chip capacitors in a sheet.
Figure 20:
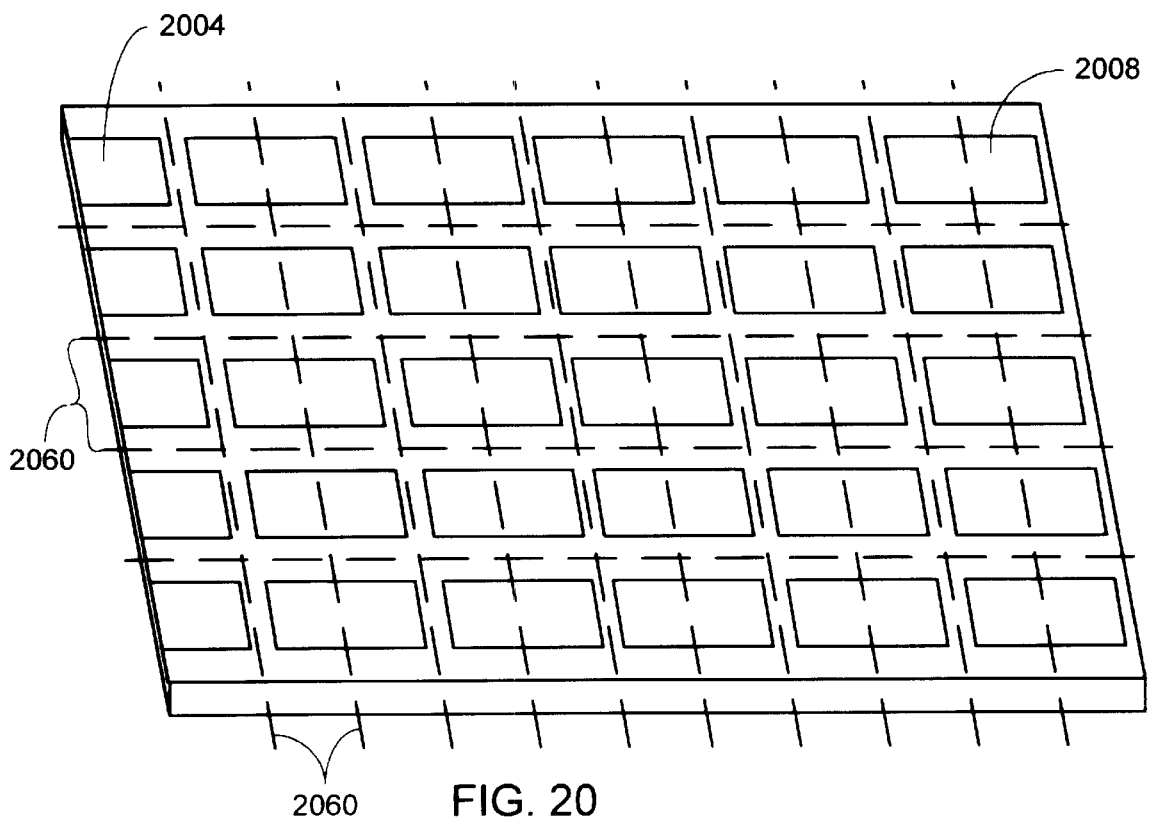
FIG. 20 is a perspective view of an insulative layer and a print electrode.

FIG. 18 is a high level flow chart of another embodiment of the invention for forming an embedded green multi-layer ceramic chip capacitor in a LTCC substrate. First green multi-layer ceramic chip capacitors are formed in a sheet (step 1804). FIG. 19 is a more detailed flow chart of the step of forming the green multi-layer ceramic chip capacitors in a sheet (step 1804). An insulative layer is first provided (step 1904). FIG. 20 is a perspective view of the insulative layer 2004. In a preferred embodiment of the invention, the insulative layer 2004 is a ceramic tape layer, which acts as a carrier. In other embodiments a carrier layer may not be used. A set of first electrodes 2008 is printed on the insulative layer 2004 (step 1908). The electrodes may be formed from a silver or silver palladium paste or any other electrically conductive material, which may be printed on the carrier layer 2004 or an insulative layer. The set of first electrodes 2008 may be dried in an oven. In an actual implementation, preferably hundreds of electrodes may be in the first set of electrodes 2008 to allow the production of hundreds of multi-layer ceramic chip capacitors on a single sheet, but less are shown to provide clarity.

Figure 21:
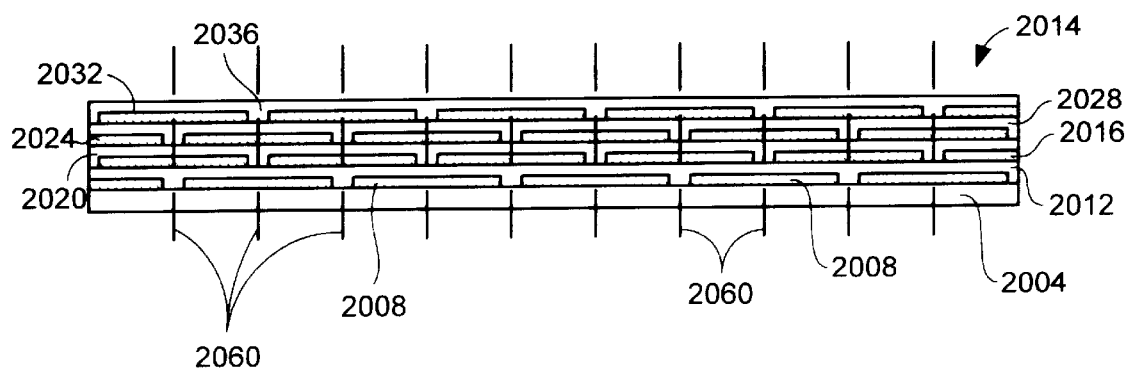
FIG. 21 is a cross-sectional view of a section of a sheet (laminate or block) of green multi-layer ceramic chip capacitors in a sheet.

To facilitate discussion, FIG. 21 is a cross-sectional view of a section of a sheet 2014 of green multi-layer ceramic chip capacitors. A dielectric casting tape is then laminated over the first electrodes 2008 and first insulative layer 2004 to form a first dielectric layer 2012 (step 1912). A second set of electrodes 2016 is printed on the first dielectric layer 2012 (step 1916). The second set of electrodes 2016 for the most part overlaps with the first set of electrodes 2008. However, a small portion of the second set of electrodes 2016 does not overlap the first set of electrodes 2008, and a small portion of the first set of electrodes 2008 is not overlapped by the second set of electrodes 2016 in a staggered manner, as shown in FIG. 21. The second set of electrodes 2016 may be dried in an oven. A second dielectric layer 2020 of dielectric casting tape is laminated over the second set of electrodes 2016 and the first dielectric layer 2012 (step 1920).

A third set of electrodes 2024 is printed the second dielectric layer 2020 (step 1924). The third set of electrodes 2024 for the most part overlaps with the second set of electrodes 2016. However, a small portion of the third set of electrodes 2024 does not overlap the second set of electrodes 2016, and a small portion of the second set of electrodes 2016 is not overlapped by the third set of electrodes 2024, as shown in FIG. 21. In the preferred embodiment, the third set of electrodes 2024 completely overlaps the first set of electrodes 2008. The third set of electrodes 2024 may be dried in an oven. A third dielectric layer 2028 of dielectric casting tape is laminated over the third set of electrodes 2024 and the second dielectric layer 2020 (step 1928).

Figure 22:
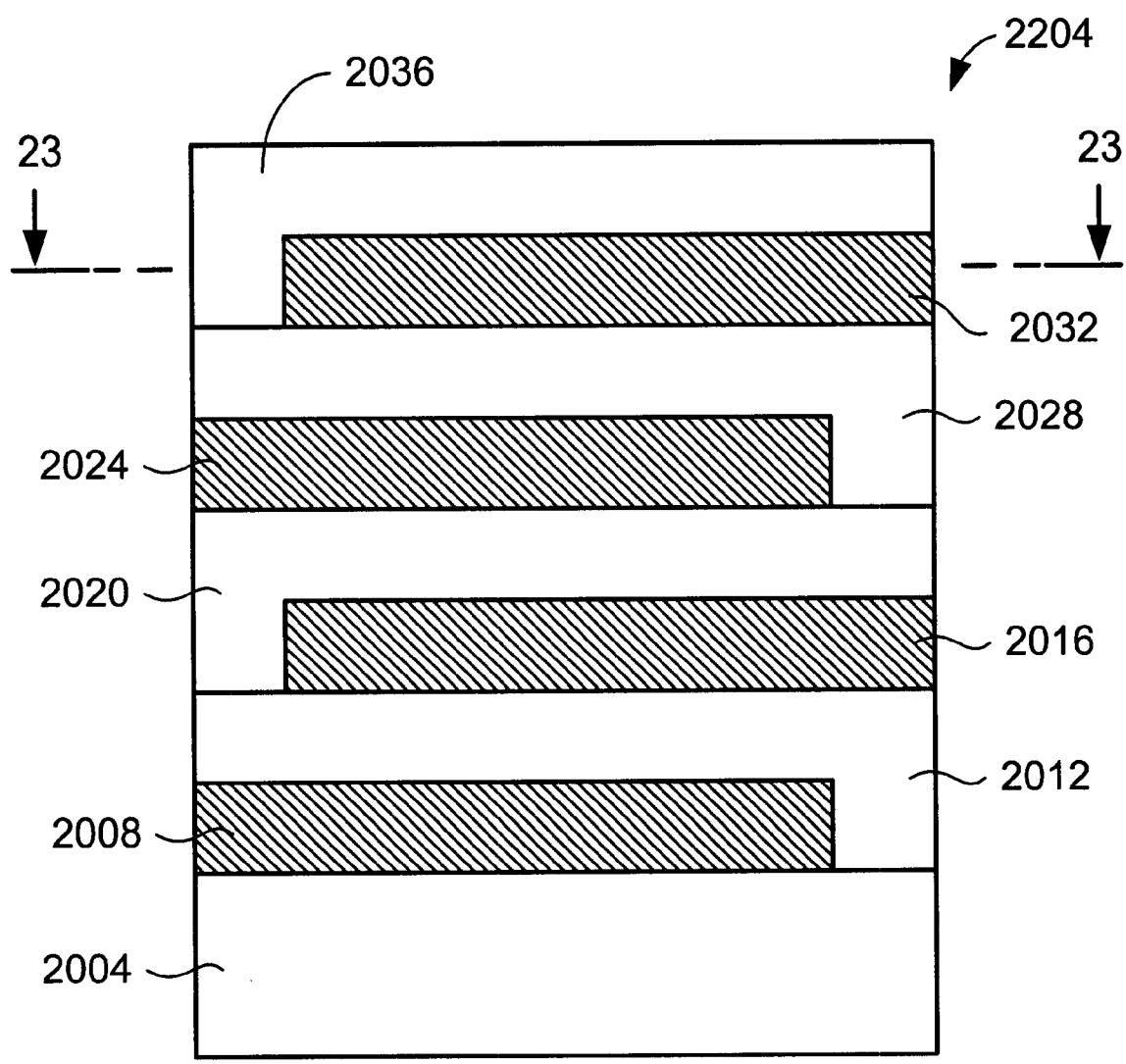
FIG. 22 is an enlarged cross-sectional view of a green multi-layer chip capacitor after singulation (cutting).
Figure 23:
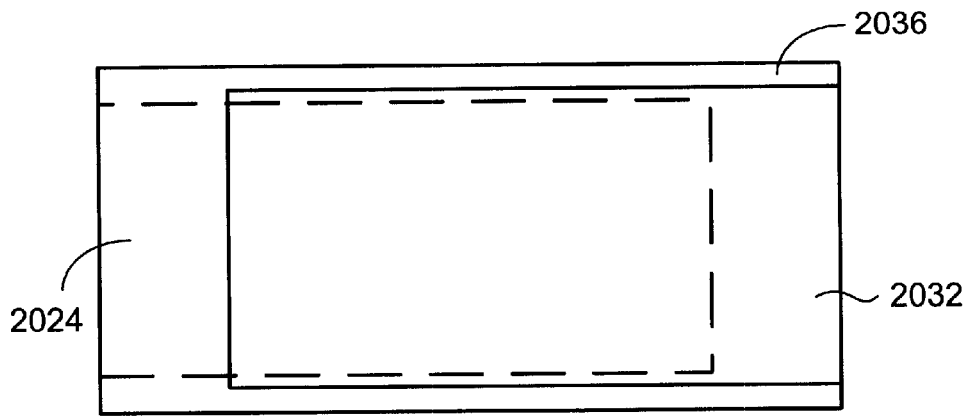
FIG. 23 is top view of the green multi-layer chip capacitor shown in FIG. 22.

The process may be continued by having a fourth set of electrodes 2032 is printed on the third dielectric layer 2028. The fourth set of electrodes 2032 for the most part overlaps with the third set of electrodes 2024. However, a small portion of the fourth set of electrodes 2032 does not overlap the third set of electrodes 2024, and a small portion of the fourth set of electrodes 2032 is not overlapped by the third set of electrodes 2024, as shown in FIG. 21. In the preferred embodiment, the fourth set of electrodes 2032 completely overlaps the second set of electrodes 2016. The fourth set of electrodes 2032 may be dried in an oven. A fourth dielectric layer 2036 of dielectric casting tape is laminated over the fourth set of electrodes 2032 and the third dielectric layer 2028. The process may be continued so that more layers of sets of electrodes are formed until a desired capacitance and/or thickness is reached. In other embodiments fewer layers may also be used. The sheet 2014 is cut along singulation lines 2060 to create the green multi-layer chip capacitors (step 1808). The separation of the green multi-layer chip capacitors may be done using a saw, laser, or other cutting or etching process. Preferably most of the electrodes are cut in two, so that each electrode forms two electrodes and so that the electrodes extend to an end of the multi-layer capacitor chips. FIG. 22 is an enlarged cross-sectional view of a resulting green multi-layer chip capacitor 2204. Each green multi-layer chip capacitor 2204 comprises a first electrode from the first set of electrodes 2008, a second electrode from the second set of electrodes 2016, a third electrode from the third set of electrodes 2024, and a fourth electrode from the fourth set of electrodes 2032. FIG. 23 is an enlarged cross-sectional top view of the resulting green multi-layer chip capacitor 2204 shown in FIG. 22 along cut lines 23—23. As shown in FIG. 23, the fourth electrode from the fourth set of electrodes 2032 is covered by a fourth dielectric layer 2036, which is placed over the third dielectric layer and the third electrode from the third set of electrodes 2024.

Figure 24:
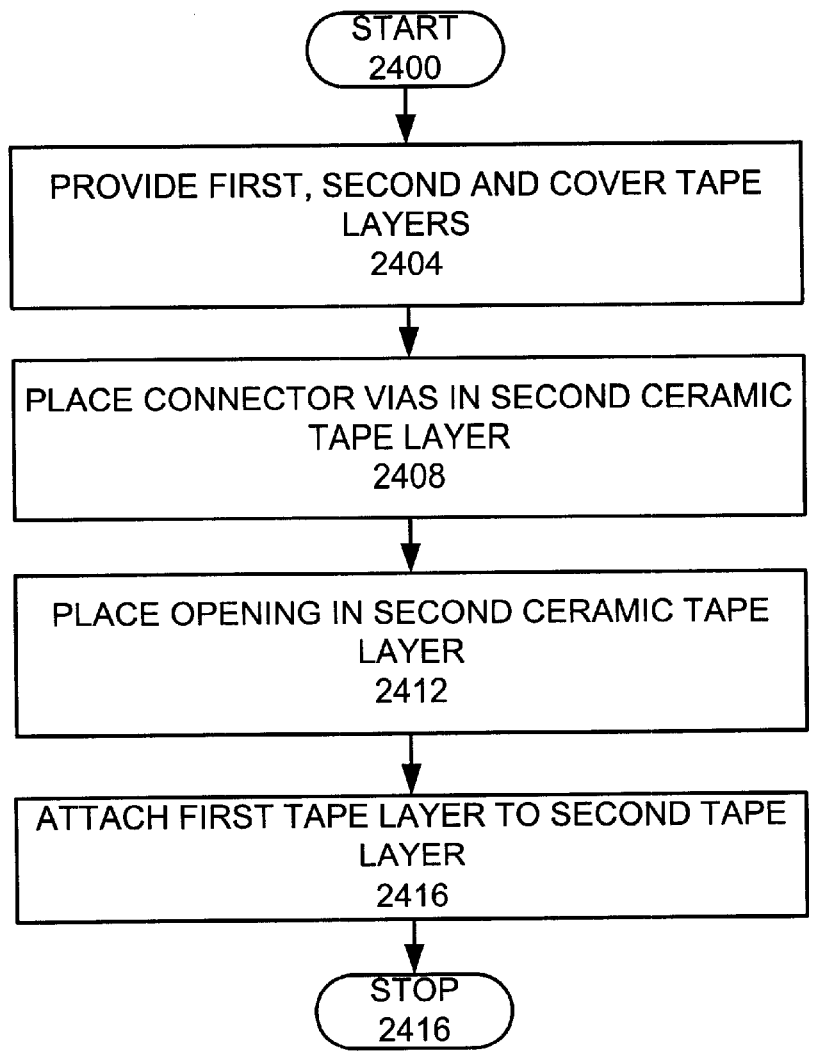
FIG. 24 is a flow chart of the step of forming a cavity in tape layers.
Figure 25:
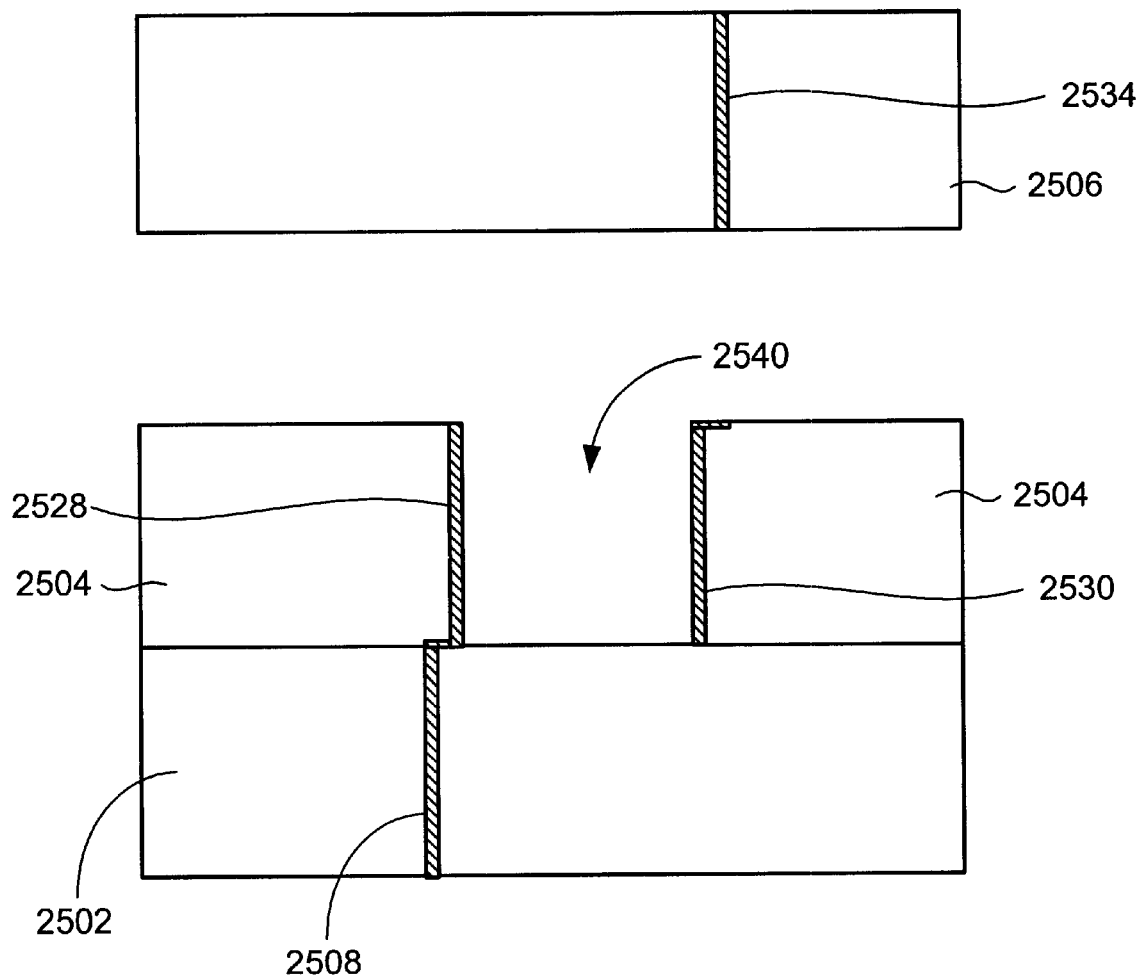
FIG. 25 is a cross-sectional view of tape layers used to form a cavity and vias, before punching the cavity.
Figure 26:
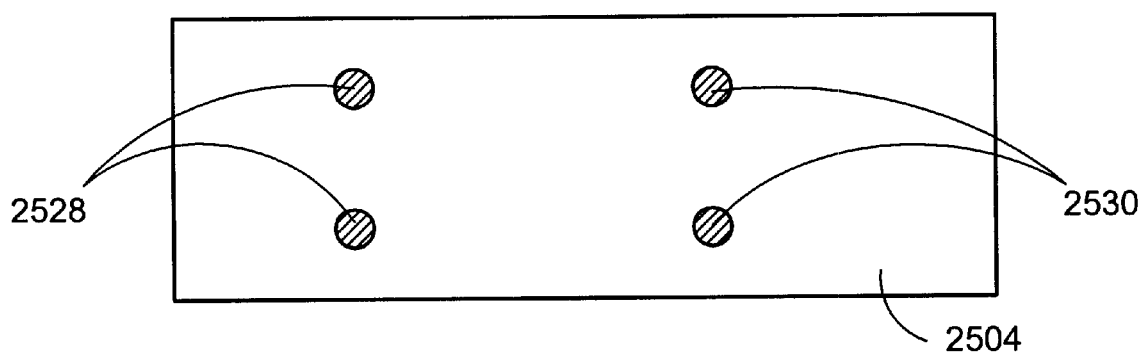
FIG. 26 is a cross-sectional view of a second tape layer with connector vias.
Figure 27:
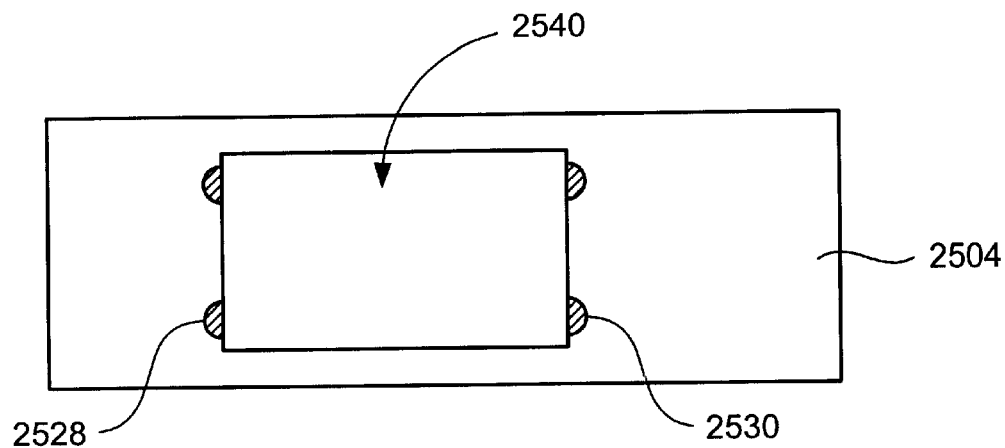
FIG. 27 is a cross-sectional view of the second tape layer with a cavity punched through the connector vias.

Next a cavity and connector electrodes are formed in ceramic tape layers (step 1812). FIG. 24 is a flow chart of the step of forming the cavity and connector electrodes in tape layers. The forming of the cavity and connector electrodes in tape layers may be performed as shown in FIGS. 9 and 10, except that the electrode layers 110, 114, 118, 122, 126 and dielectric layers 112, 116, 120, 124 are not formed in the cavity, but instead a chip capacitor 2204 is formed outside of the cavity and then placed in the cavity. A first ceramic tape layer 2502, a second ceramic tape layer 2504, and a cover tape layer 2506 are provided (step 2404), as shown in FIG. 25. Connector vias 2528, 2530, which are filled with a conductive material such as silver, are placed in the second ceramic tape layer 2504 (step 2408). FIG. 26 is a top view of the second ceramic tape layer 2504 after the connector vias 2528, 2530 have been placed, but before the second tape layer 2504 is punched. Vias 2508, 2534 may also be formed in the first tape layer 2502 and the cover tape layer 2506. An opening 2540 is punched through the second tape layer 2504 so that the connector vias 2528, 2530 are cut (step 2412), preferably bisected, by the opening 2540, as shown in FIG. 27. The first ceramic tape layer 2502 may be attached to the second ceramic tape layer 22504 to cover one side of the opening 2540 (step 2416), thus forming a cavity with a closed end. In other embodiments, the cavity may be formed in a single layer of ceramic tape or in more than two layers of ceramic tape.

Figure 28:
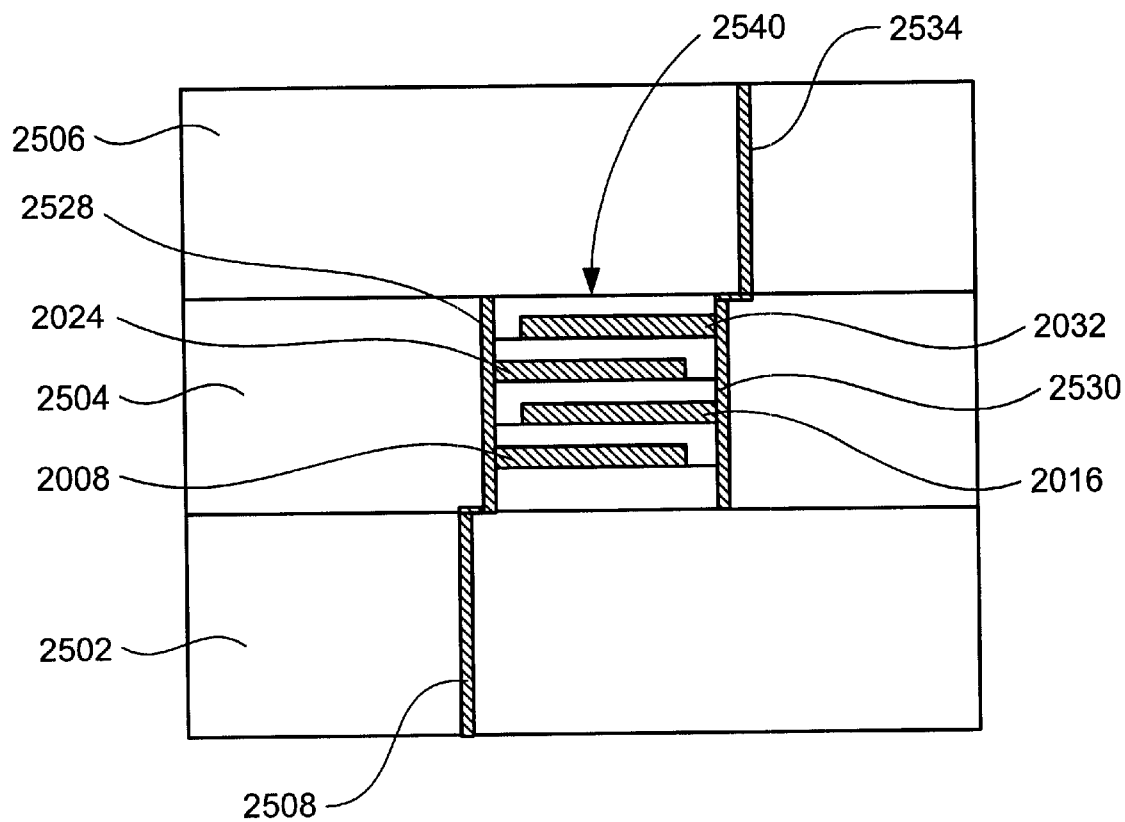
FIG. 28 is a cross sectional view of a green multi-layer chip capacitor placed in the cavity.

One of the green multi-layer chip capacitors 2204 is placed in the cavity (step 1816), as shown in FIG. 28. The cover tape layer of tape 2506 is placed over the cavity to seal the multi-layer chip capacitor 2204 into the cavity. In the preferred embodiment, the first connector electrode 2528 is electrically connected to the first electrode 2008 and the third electrode 2024 and insulated from the second electrode 2016 and fourth electrode 2032, and the second connector electrode 2530 is electrically connected to the second electrode 2016 and the fourth electrode 2032 and insulated from the first electrode 2008 and third electrode 2024. In essence, each electrode is formed so that successive electrodes are connected to alternate connector electrodes 2528, 2530. The tape layers 2502, 2504, 2506 are pressed together and fired (step 1824). The tape layers may be laminated together before firing. In a standard LTCC substrate, additional layers are used to form additional circuitry. These additional layers and additional circuitry are not shown and are omitted from discussion for clarity. Inserting the multi-layer chip capacitors 2204 into cavities may provide an easier method of manufacturing multi-layer chip capacitors.

In a preferred embodiment, the insulative layer 2004 and/or the first, second, third, and fourth dielectric layers 2012, 2020, 2028, 2036 are made of green ceramic material, which may be the same material as the tape layers 2502, 2504, 2506. In such an embodiment, the firing may also be used to harden the insulative layer 2004 and/or the first, second, third, and fourth dielectric layers 2012, 2020, 2028, 2036. In addition, during the firing, the capacitor chip 2064 shrinks at about the same rate as the tape layers 2502, 2504, 2506, minimizing gaps or stress between the capacitor chip 2064 and the cavity walls due to different shrink rates. In addition, the firing changes paste used to form the electrodes into a permanent electrical connector.

Figure 29:
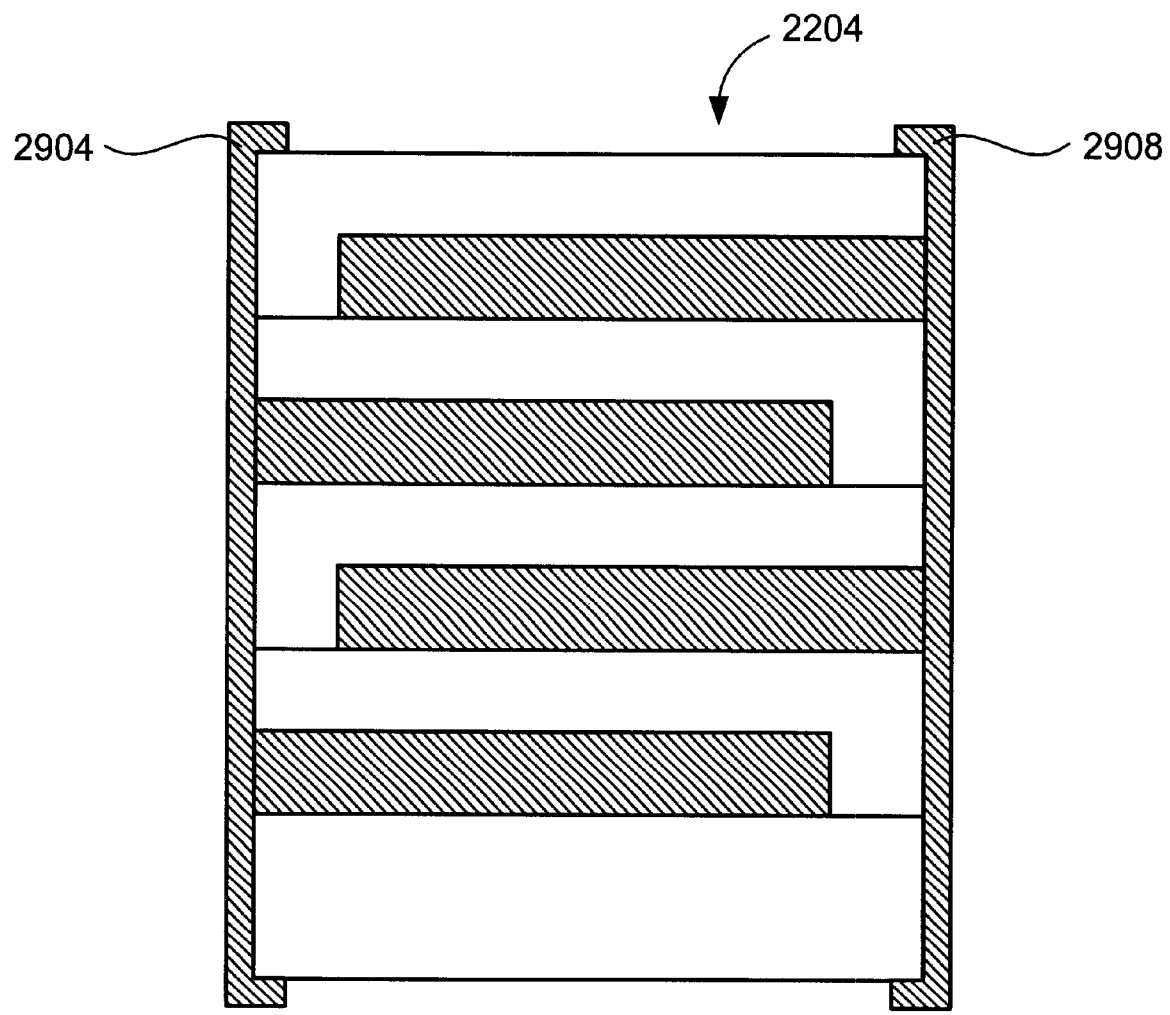
FIG. 29 is an enlarged cross-sectional view of a green multi-layer chip capacitor after outer conductive layers have been formed.

In another embodiment, conductive paste, such as silver or silver/lead, may be applied to the sides of the multilayer chip capacitor 2204, to form outer conductive layers 2904, 2908, as illustrated in FIG. 29, before the multilayer chip capacitor 2204 is placed in a cavity. The outer conductive layers 2904, 2908 provide an improved electrical connection with the connector electrodes 2528, 2530.

Different shapes, sizes, and placement of the electrodes and contact electrodes as described in the previous embodiments and shown in FIG. 13 may be used in this embodiment. In such embodiments, the sheet is preferably cut into chips of single multilayer capacitors (singulated). In another embodiment, the sheet may be cut into chips of multiple multi-layer capacitors, which are side by side and placed in a single cavity.

Those skilled in the art will appreciate that various adaptations, modifications, permutations, and substitute equivalents of the just-described preferred embodiments can be configured without departing from the scope and spirit of the invention. The present invention, in general, is an apparatus and method for forming an embedded multi-layer capacitor in an LTCC substrate by forming green multi-layer ceramic chip capacitors, which are placed in cavities. Therefore, it is to be understood that, within the scope of the appended claims, the invention may be practiced other than as specifically described herein.

What is claimed is:

1. A method of providing an embedded multi-layer capacitor in a low-temperature co-fired ceramic (LTCC) substrate formed by at least one layer of ceramic tape, the method comprising:
   forming a plurality of multi-layer capacitors in a sheet;
   cutting the sheet to form some of the plurality of multi-layer capacitors into a plurality of multi-layer capacitor chips;
   forming a plurality of connector electrodes, comprising:
      forming a plurality of vias in the ceramic substrate; and
      filling the vias with a paste of conductive material;
   forming at least one cavity in the ceramic substrate by punching in at least one layer of ceramic tape
   placing at least one multi-layer capacitor chip of the plurality of multi-layer capacitor chips into the at least one cavity in the ceramic substrate.

2. The method, as recited in claim 1, wherein the forming of the plurality of multi-layer capacitors in the sheet, comprises:

forming a first set of electrodes;
placing a first dielectric sheet over the first set of electrodes;
forming a second set of electrodes over the first dielectric sheet, wherein the second set of electrodes at least partially overlap with the first set of electrodes;
forming a second dielectric sheet over the second set of electrodes and the first dielectric sheet; and
forming a third set of electrodes over the second dielectric sheet, wherein the third set of electrodes at least partially overlaps the second set of electrodes.

3. The method, as recited in claim 2, wherein a first connector electrode is electrically connected to the electrodes of the first set electrodes and the third set electrodes and a second connector electrode is electrically connected to an electrode.

4. The method, as recited in claim 3, wherein the forming of the plurality of multilayer capacitors in a sheet, further comprises:
   forming a third dielectric sheet over the third set of electrodes and the second dielectric sheet; and
   forming a fourth set of electrodes with a fourth electrode over the third dielectric sheet, wherein the second connector electrode is electrically connected to the fourth electrode.

5. The method, as recited in claim 3, wherein the punching of the cavity bisects the filled vias.

6. The method, as recited in claim 5, wherein the first set of electrodes, the second set of electrodes, the third set of electrodes, and the fourth set of electrodes are formed by a paste of conductive material.

7. The method, as recited in claim 6, wherein the paste of conductive material filing the vias and the paste of conductive material forming the first set of electrodes, the second set of electrodes, the third set of electrodes, and the fourth set of electrodes join together to form permanent electrical connections during the firing the covering, the ceramic substrate, and the multi-layer capacitor chip together.

8. The method, as recited in claim 7, wherein the first dielectric sheet, the second dielectric sheet, and the third dielectric sheet are made of green ceramic material.

9. The method, as recited in claim 8, wherein the first dielectric sheet, the second dielectric sheet, and the third dielectric sheet are made of the same material as the covering.

10. The method, as recited in claim 1, wherein the punching the at least one cavity cuts the filled vias.

11. The method, as recited in claim 10, further comprising placing a covering over the cavity with the at least one of the plurality of multi-layer capacitor chips therein.

12. The method, as recited in claim 11, wherein the covering is another ceramic tape, and further comprising firing the covering, the ceramic substrate, and the multi-layer capacitor chip together.

13. The method, as recited in claim 1, wherein the punching of the cavity bisects the filled vias.

14. The method, as recited in claim 1, further comprising placing a covering over the cavity with the at least one of the plurality of multi-layer capacitor chips therein.

15. The method, as recited in claim 14, wherein the covering is another ceramic tape and further comprising firing the covering, the ceramic substrate, and the multi-layer capacitor chip together.

16. The method, as recited in claim 15, wherein the punching of the cavity bisects the filled vias.

* * * * *